(12) United States Patent
Goldbach et al.

(10) Patent No.: US 7,009,900 B2
(45) Date of Patent: Mar. 7, 2006

(54) CIRCUIT ARRANGEMENT FOR READING OUT, EVALUATING AND READING IN AGAIN A CHARGE STATE INTO A MEMORY CELL

(75) Inventors: Matthias Goldbach, Dresden (DE); Bernhard Sell, Portland, OR (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/944,536

(22) Filed: Sep. 17, 2004

(65) Prior Publication Data

US 2005/0099879 A1     May 12, 2005

Related U.S. Application Data

(63) Continuation of application No. PCT/DE03/00887, filed on Mar. 18, 2003.

(30) Foreign Application Priority Data

Mar. 18, 2002   (DE)   ............................... 102 11 932

(51) Int. Cl.
*G11C 7/00*   (2006.01)

(52) U.S. Cl. .................................. 365/205; 365/225.7

(58) Field of Classification Search ................ 365/205, 365/225.7
See application file for complete search history.

(56) References Cited

U.S. PATENT DOCUMENTS

| 4,873,668 | A | * | 10/1989 | Winnerl et al. | ........ | 365/189.08 |
| 4,916,665 | A | * | 4/1990 | Atsumi et al. | ......... | 365/185.21 |
| 5,283,761 | A | | 2/1994 | Gillingham | | |
| 5,384,730 | A | | 1/1995 | Vinal | | |
| 5,696,725 | A | | 12/1997 | Kim | | |
| 5,748,520 | A | * | 5/1998 | Asaka et al. | ................. | 365/149 |

FOREIGN PATENT DOCUMENTS

JP              10233092 A       9/1998

* cited by examiner

*Primary Examiner*—Michael Tran
(74) *Attorney, Agent, or Firm*—Slater & Matsil, L.L.P.

(57) ABSTRACT

A circuit arrangement includes a bit line (10), a reference bit line (12), a sense amplifier with two cross-coupled CMOS inverters, which in each case comprise an n-channel transistor (20, 22) and a p-channel field-effect transistor (30, 32), and also, at the respective source terminals, two voltage sources (40, 42), of which the voltage source (40) linked to the n-channel field-effect transistors can be driven from a lower through to an upper potential and the voltage source (42) linked to the p-channel field-effect transistors (30, 32) can be driven from the upper through to the lower potential. With this circuit arrangement, it is possible to store three different charge states in the memory cell (4) on the bit line (10) if the threshold voltages ($U_{TH1}$, $U_{TH2}$) at the transistors are chosen to be greater than half the voltage difference between the lower and upper voltage potentials. This can be achieved by production engineering or, for example, by changing the substrate bias voltage. The third charge state can be utilized for binary logic or for detecting a defect in the memory cell (4).

18 Claims, 2 Drawing Sheets

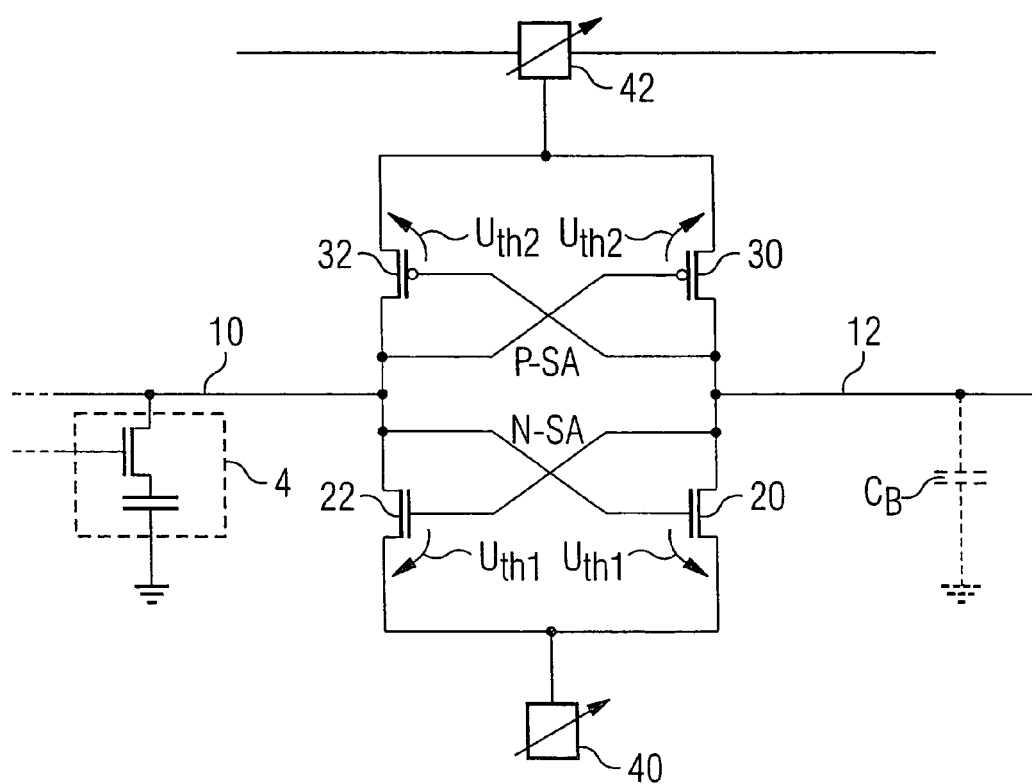

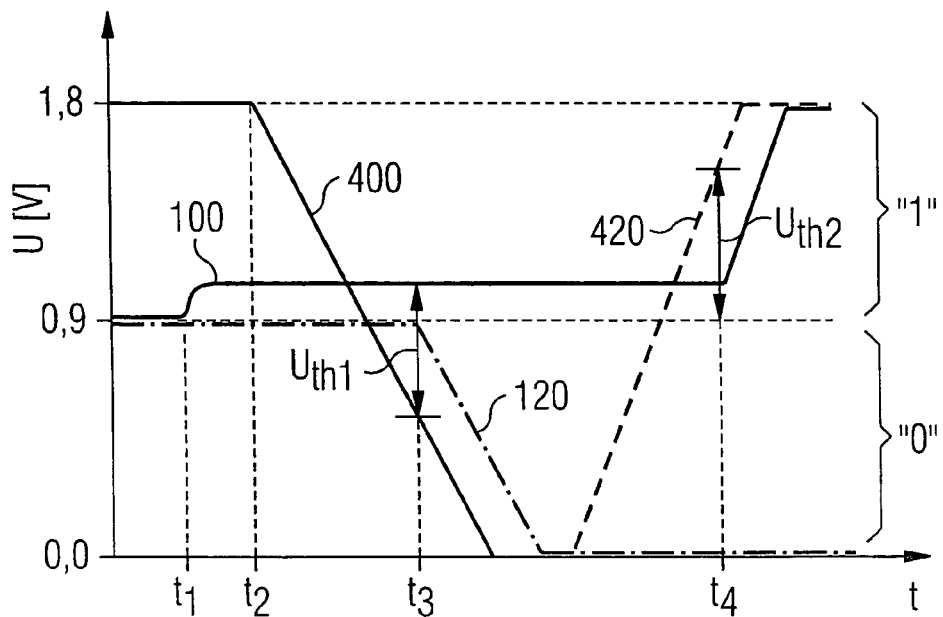
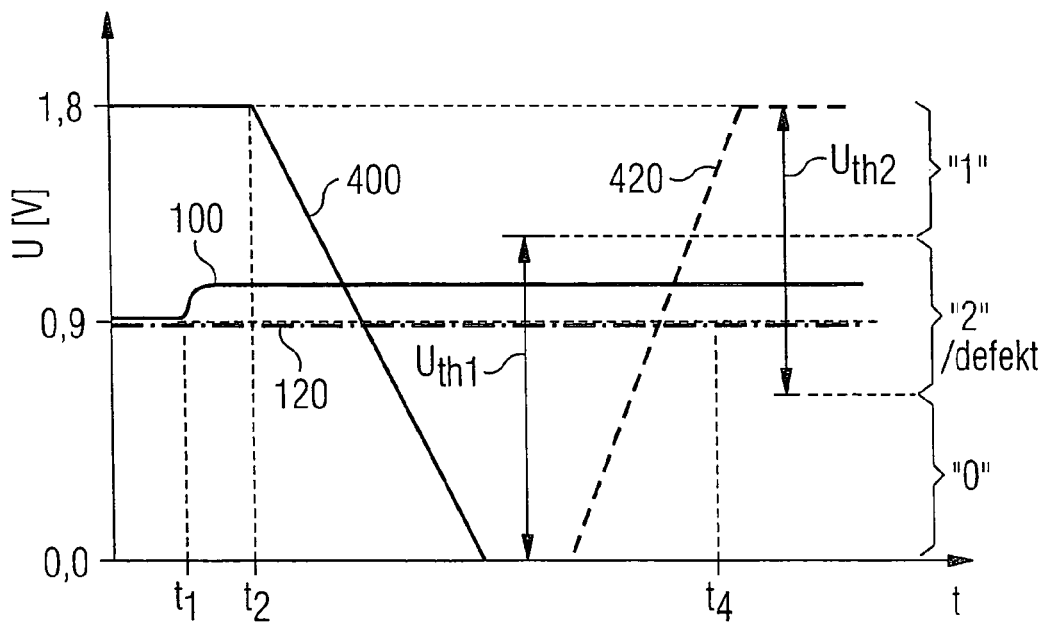

CIRCUIT ARRANGEMENT FOR READING OUT, EVALUATING AND READING IN AGAIN A CHARGE STATE INTO A MEMORY CELL

This application is a continuation of co-pending International Application No. PCT/DE03/00887, filed Mar. 18, 2003, which designated the United States and was not published in English, and which is based on German Application No. 102 11 932.5 filed Mar. 18, 2002, both of which applications are incorporated herein by reference.

TECHNICAL FIELD

The present invention relates to a circuit arrangement for reading out, evaluating and reading in again a charge state into a memory cell.

BACKGROUND

Processes and memories that are produced and used at the present time usually operate in binary logic. The logic states "0" and "1" thereby prescribed are in each case allocated a charge or voltage state in the corresponding electrically operated circuit arrangements.

Dynamic random access memory cells (so-called DRAM cells) comprise a selection transistor and a storage capacitor. In order to define a charge state in the storage capacitor, a voltage of 0.9 V may be applied for example to the counterelectrode—this is a doped buried well in the case where trench capacitors are used. The two charge states can then be achieved by the storage node being brought to a voltage potential of either 0 V or to 1.8 V.

Dynamic memories have the property that they have to be reloaded again at regular intervals, which is referred to as a so-called refresh. This is due to leakage currents which result in any charge stored in the capacitor gradually flowing away. In order to carry out a refresh, the charge information is read from a memory cell by means of the selection transistor and compared with a reference charge or voltage value, e.g., by means of an amplifier unit. The reference value serves as a limit between the charge or voltage value range corresponding to the logic state "1", or that corresponding to the logic state "0".

Ideally, the voltage state of a cell is at a voltage value, for example 0V or 1.8 V, allocated to it during a charge writing process. Due to the above-mentioned leakage currents, in time these written voltage values strive toward an equilibrium state, which may be about 0.9 V in this example. During the read-out process there is the added factor that the bit line voltage decreases from 1.8 V to 1.2 V, for example, depending on the coupling ratio between bit line and capacitor. In the event that there is still sufficient distance between such an adapting voltage value and the reference value of 0.9 V, set at the equilibrium state, by means of the amplifier unit, it is possible, during the refresh process, for the value of 1.2 V to be assigned to the upper voltage range of the logic state "1" and for the ideal value 1.8 V to be written again to the storage capacitor via the selection transistor by means of the amplifier unit.

However, the situation often arises wherein a memory cell is defective, so that a charge or voltage state can no longer be written to the memory cell. Therefore, during read-out, a voltage value near the equilibrium state is typically output, which value thus also lies near the reference value for the voltage. Since either one voltage state or the other must be rewritten by the amplifier units used heretofore for the refresh, an erroneous refresh can occur. Since a read-out process is generally coupled to a refresh process, a charge state that was not actually originally stored can be simulated for the read-out in this case.

Such error handling is usually realized by means of additional check bits in the memory area. By way of example, a parity bit may be stored in a memory cell required for this purpose, the parity bit being produced logically from the information of a cell sequence connected to a bit line. One disadvantage here is that a non-negligible outlay for calculation and verification of the check bits has to be expended both spatially and temporally.

The document JP 10-233092 A (and corresponding U.S. Pat. No. 5,696,725) discloses a sense amplifier in which the threshold voltage of n-MOS amplifier transistors can be changed by varying the bulk voltage.

SUMMARY OF THE INVENTION

One aspect of the present invention provides a circuit arrangement, which can be used to detect defective memory cells without having to take account of additional check bits in memory cells that have been additionally set up.

Another aspect is achieved by means of a circuit arrangement for reading out, evaluating and rewriting a charge state to a memory cell. The arrangement comprises a bit line; the memory cell, which is connected to the bit line; a reference bit line; a reference memory cell for providing a comparison potential, which is connected to the reference bit line' a first n-channel field-effect transistor, whose gate terminal is connected to the reference bit line and whose drain terminal is connected to the bit line; a second n-channel field-effect transistor, whose gate terminal is connected to the bit line and whose drain terminal is connected to the reference bit line; a first p-channel field-effect transistor, whose gate terminal is connected to the reference bit line and whose drain terminal is connected to the bit line; a second p-channel field-effect transistor, whose gate terminal is connected to the bit line and whose drain terminal is connected to the reference bit line; a first voltage source, which is connected to the source terminal of the first and second n-channel field-effect transistors; and a second voltage source, which is connected to the source terminal of the first and second p-channel field-effect transistors. The first and second n-channel field-effect transistors have a first threshold voltage and the first and second p-channel field-effect transistors have a second threshold voltage. The first voltage source is designed for driving a voltage potential from an upper through to a lower limit and the second voltage source is designed for driving a voltage potential from the lower through to the upper limit. The magnitudes of the threshold voltages of the field-effect transistors are in each case greater than half the potential difference between the upper and lower limits of the voltage potential.

The circuit arrangement corresponds to a cross-coupled CMOS inverter as sense amplifier. The latter has, according to the invention, the particular property that the threshold voltages of the field-effect transistors, of which at least two are respectively required per CMOS inverter, are set in such a way that an evaluation or a comparison of the voltage state read from the cell with a reference value is not effective. It follows from this that a reading in again (refresh) of one of the two possible voltage states into the storage capacitor is not effected either. A third charge state lying between the two existing voltage states is defined by this arrangement. Such a charge or voltage state is defined precisely when the threshold voltages of the field-effect transistors of the cross-coupled CMOS inverter circuit as sense amplifier are at least half as large as the potential difference between the two ideal voltage states. These were 0 V and 1.8 V in the above example. This is because it is precisely then that the voltage sources driving through the two voltage ranges are no longer conductively switched by one of the field-effect transistors in one of the two halves of the total voltage range, neither with the bit line nor with the reference bit line nor within one of the voltage ranges. Depending on the extent to which the magnitude of the threshold voltage lies above half the voltage difference between the upper and lower voltages, the ideal values, their results a differently sized interval of those voltage values which are read from the storage capacitor for which the transistors of the sense amplifier do not start. In the above example, the threshold voltages must lie above 0.9 V in order to fulfill this condition according to the invention.

By means of the circuit arrangement according to the invention, for the read-out of the memory cell, the bit line is precharged to 0.9 V, for example, and short-circuited with the storage capacitor via a selection transistor. A reference bit line is likewise precharged with 0.9 V. The bit line and reference bit line are respectively connected to the gate terminals of two field-effect transistors. The comparison of the two voltage values is carried out by the voltage source being trimmed through the voltage range from an upper value, which is 1.8 V in the above example, toward negative values in each case on the side of the n-channel field-effect transistors, at the source terminals thereof. If both n-channel field-effect transistors are provided with the same threshold voltage, then the potential—present at the gate terminal—of the bit line or reference bit line decides which field-effect transistor starts first, since the same potential is present at the source terminal. That bit line to which a higher potential is applied is the first to effect an electrically conductive connection between the varying voltage source and precisely the other bit line. As a result of charge flowing away via the affected field-effect transistor in the direction of the voltage source with the decreasing potential, the other bit line, which had the voltage that was lower in the comparison anyway, is thus driven down to the lower potential.

The two p-channel field-effect transistors of the cross-coupled circuits are connected in complementary fashion at their source terminals to a voltage source which increases their potential and, as a countermove, precisely the other way around, drives the first bit line, whose potential is still unchanged up to the upper voltage value.

Accordingly if at least one of the two voltage sources meets the lower, or upper, target value of the voltage after driving, and if the voltage difference between the target value and the voltage potential of the bit lines that is present at the gate terminals is not as far apart as would be demanded by the threshold voltage for turning on the field-effect transistor, then, consequently, the potentials of the respective bit lines are also not changed.

In one refinement of the invention, it is provided that the values of the first and second threshold voltages of the p- and n-channel field-effect transistors have an essentially identical magnitude. This is advantageous in particular both when the threshold voltage of the field-effect transistors is defined on the basis of technological process steps and when the threshold voltage of the field-effect transistors is influenced by a substrate bias voltage potential. The corresponding production or control method of the circuit arrangement is simplified considerably as a result.

In a further refinement, it is provided that at least one of the field-effect transistors has a bulk terminal, that the bulk terminal is connected to a voltage source for generating a substrate bias voltage potential, and that the voltage source for generating a substrate bias voltage potential is adjustable between at least two different values for the substrate bias voltage potential. This refinement is particularly advantageous if a test of the memory cells of a memory module is to be checked for defects only at defined points in time. In this case, for a memory test, the substrate bias voltage is set in such a way that the threshold voltages are set beyond half the voltage difference between the two binary charge states of the memory to an extent such that a third charge state joins the two charge states. The third charge state can be read out and evaluated for the further handling of the defective memory cell. It is particularly advantageous, upon detection of a corresponding charge state, to output a signal on the basis of which the relevant memory cell in the memory cell array is deactivated by means of a fuse. This opens up the possibility of "fusing" a cell, i.e., interrupting the electrical connection to other components, without having to implement an expensive fuse algorithm externally.

A normal memory operation with binary charge states can be set again directly afterward or sometime later by changing over the substrate bias voltage.

A further refinement of the present invention provides for the value of the first and second threshold voltages to be essentially two thirds of the difference between the upper and lower limits of the voltage potential. As a result, precisely one third of the entire voltage range is in each case allocated equally now in the now three charge states.

The invention also comprises a method for operating the circuit arrangement, comprising the following steps: read-out of a charge from the memory cell for the purpose of generating a voltage potential on the bit line; read-out of a charge from the reference memory cell for the purpose of generating a voltage potential on the reference bit line; driving of a voltage potential by means of the first voltage source from a first value through to a second value; driving of a voltage potential by means of the second voltage source from the second value through to the first value; and reading-in again of the voltage potential on the bit line for the purpose of storing one of the three possible stable charge states in the memory cell.

A further refinement provides for the circuit arrangement to be operated by means of a control unit with ternary logic. In this case, by way of example, a logic "2" is allocated to the third charge state. As a result, it is advantageously possible to store 1.5 bits per cell. For a memory of given physical size, this results in a storable information density increased by almost 50%.

A particular advantage of the present invention is that it is not necessary to implement any technological outlay for producing the circuit arrangement.

Further refinements of the present invention are described herein.

BRIEF DESCRIPTION OF THE DRAWINGS

The present invention will now be explained in more detail using an exemplary embodiment with the aid of drawings, in which:

FIG. 1 shows the circuit arrangement with the threshold voltages $U_{TH1}$ and $U_{TH2}$ of the n- and p-channel field-effect transistors, respectively; and FIGS. 2a and 2b, collectively FIG. 2, show the temporal profile of the voltages of the voltage sources, and also on the bit lines in the case of a conventional choice of the threshold voltages (a) and in the case of a choice of the threshold voltages according to the invention (b).

DETAILED DESCRIPTION OF ILLUSTRATIVE EMBODIMENTS

FIG. 1 shows a circuit arrangement with an identification of the threshold voltages $U_{TH1}$ of the n-channel field-effect transistors and $U_{TH2}$ of the p-channel field-effect transistors, which threshold voltages can be used according to the invention. A memory cell 4 with a storage capacitor and a selection transistor can be seen in the equivalent circuit diagram on the left, illustrated by broken lines. The memory cell 4 is coupled to a bit line 10 leading to the sense amplifier of the circuit arrangement. The sense amplifier comprises two cross-coupled CMOS inverters—or, considered from a different standpoint, one n-sense amplifier and one p-sense amplifier with in each case two field-effect transistors of the same conduction type. The bit line 10 is connected to the gate terminal of an n-channel field-effect transistor 20 and the gate terminal of a p-channel field-effect transistor 30. The two field-effect transistors 20, 30 are configured as CMOS inverters between two voltage sources 40, 42 which are drivable in terms of their voltage. The drain terminals of the field-effect transistors 20, 30 are jointly connected to a reference bit line 12, on which a reference memory cell 6 is situated, for example. The reference bit line 12 may be an arbitrary other bit line present in the memory cell array. The voltage source 40 coupled to the n-channel field-effect transistor 20 can be driven from an upper voltage value 1.8 V through to a lower voltage value 0 V. The voltage source 42 coupled to the p-channel field-effect transistor 30 can be driven from a lower value 0 V through to an upper voltage value 1.8 V.

In symmetrical fashion with respect to the first-mentioned CMOS inverter, the reference bit line 12 is connected to the gate terminal of an n-channel field-effect transistor 22 and a gate terminal of a p-channel field-effect transistor 32, which are connected by their drain terminals to the bit line 10 of the memory cell 4. The source inputs of the above-mentioned field-effect transistors 22, 32 are in each case connected to the above-mentioned drivable voltage sources 40 and 42, respectively.

What is characteristic of the exemplary embodiment of the present invention is that the n-channel field-effect transistors 20, 22 have a threshold voltage $U_{TH1}$ of +1.2 V and the p-channel field-effect transistors 30, 32 have a threshold voltage $U_{TH2}$ of −1.2 V. These threshold voltages turn on the field-effect transistors between the source and drain terminals if, in the case of the n-channel field-effect transistors 20, 22, the voltage $U_{GS}$ between gate and source terminals becomes greater than the threshold voltage or, in the case of the p-channel field-effect transistors 30, 32, the voltage $U_{GS}$ between gate and source terminals becomes less than the threshold voltage $U_{TH2}$.

In the exemplary embodiment, a charge is stored in the memory cell 4, which charge leads to a potential of 1060 mV as a result of activation of the selection transistor of the memory cell 4 on the bit line 10 at the instant of the read-out by means of the sense amplifier of the circuit arrangement. The bit line 10 was biased with 0.9 V. The reference bit line 12 is likewise biased with 0.9 V.

Thus, the field-effect transistors of the circuit arrangement are, in particular, normally off n-MOSFETs and normally off p-MOSFETs.

FIG. 2b shows the temporal profile of individual voltage potentials in the case of an application of the circuit arrangement according to the invention. The voltage potential 100 on the bit line 10 begins with the bias voltage at 0.9 V, as can be seen on the left-hand side in FIG. 2b. At the time $t_1$, the selection transistor of the memory cell 4 switches a connection of the storage capacitor to the bit line 10, so that the charge flows onto the bit line 10 and leads to an increase in the voltage potential 100 to 1060 V in this example. At an instant $t_2$ shortly afterward, the voltage potential 400 of the voltage source 40 is driven down continuously from a previously constant start value at 1.8 V. At the same time, a constant bias voltage potential 120 of 0.9 V is present on the reference bit line 12. From the comparison of the time-dependent voltage potential 400, which falls continuously, with the voltage potentials 100 at the gate terminal of the transistor 20 and also 120 at the gate input of the transistor 22, which in each case defines a gate-source voltage, with the threshold voltage $U_{TH1}$ of the two transistors at the level of +1.2 V, it emerges that the transistors 20 or 22 are turned on only if the voltage potential 400 reaches a value of 1060 mV−1200 mV=−140 mV, or 900 mV−1200 mV=−300 mV. This situation no longer occurs here, however, since the voltage source 40 drives the voltage potential 400 down only to 0.0 V.

Afterward, the voltage potential 420, which has hitherto been constant at 0 V, is driven up continuously to a value of 1.8 V by the voltage source 42. The values of the voltage potentials 100, 120 at 1060 mV and 900 mV, respectively, which values have remained unchanged after the first voltage sweep of the voltage potential 400, are not changed in this voltage sweep either since the threshold voltage $U_{TH2}$ of −1200 mV is below (greater in terms of magnitude) the gate-source voltage of the transistors 30, 32. In particular, an upper voltage value of 2100 mV or 2260 mV, respectively, would have to be achieved in order to turn on the transistors 30 or 32, which cannot be the case here. In this voltage sweep too, the voltage potentials on the bit line 10 and the reference bit line 12 remain unchanged.

As can be seen from the graphical representation of the threshold voltages $U_{TH1}$ and $U_{TH2}$ in FIG. 2b, the latter define a voltage range of from 600 mV to 1200 mV within which voltage potentials present on the bit lines 10 or reference bit lines 12 are not changed by the read-out device, i.e., the voltage sources 40, 42, in the transistors 20, 22, 30, 32. It can clearly be understood that the limits of this range can be shifted by changing the threshold voltages $U_{TH1}$, $U_{TH2}$. The larger the threshold voltages, the larger, too, this voltage range becomes, which is indicated in FIG. 2b with the logic "2" in an application with binary logic or with the indication "defective" in the application as detection range for defective memory cells. In accordance with an advantageous refinement, it is also possible to choose the threshold voltages $U_{TH1}$ of the transistors 20 and 22 such that they are not identical, but rather different. This is the case in particular when it is desirable that, if the voltage potential 100 is 1500 mV, for example, and is thus raised to 1.8 V in the second voltage sweep, the voltage potential 120 of the reference bit line 12 is also pulled down to 0 V in the first voltage sweep. To that end, the threshold voltage $U_{TH1}$ only of the transistor 22 would have to be below 900 mV, so that the latter can still be turned on when the voltage potential 400 of the first voltage source 40 is driven down. By contrast, the voltage potential 100 of the bit line 10 should still be tested with respect to a threshold voltage $U_{TH1}$ according to the invention at the transistor 20 of more than 900 mV.

According to the invention, in accordance with one refinement, the substrate bias voltage can be changed in such a way that the threshold voltages $U_{TH1}$ and $U_{TH2}$ also change. If the method of the exemplary embodiment just described is only used for a memory test, then the size of the threshold voltages can be chosen to be less than 900 mV in the present example during later operation, by changing over the substrate bias voltage, so that the logical assignment to the states "0" and "1" is present, as is illustrated in FIG. 2a. The threshold voltages $U_{TH1}$ and $U_{TH2}$ are both 300 mV here. The initial state up to the instant $t_2$ is the same as described in FIG. 2b. When the voltage potential 400 is driven down, a gate-source voltage at the n-channel field-effect transistor 20 of 300 mV is reached at an instant $t_3$, since the voltage potential 400 of the voltage source 40 is in this case 760 mV and the voltage potential 100 of the bit line 10 is in this case 1060 mV. From this point, the field-effect transistor 20 is turned on and the bit line 12 discharges toward the voltage source 40, so that the voltage potential 120 falls sharply and reaches the value of 0 V with a time offset with respect to the voltage potential 400.

Afterward, the voltage potential 420 of the voltage source 42 is driven up from 0 V to 1.8 V, so that, at an instant $t_4$, at which the voltage potential 420 reaches a value of 1200 mV, the threshold voltage of the transistor 32, $U_{TH2}$, of −300 mV reaches the gate-source voltage between the voltage potential 120 of 0 V and the voltage profile 420 of 300 mV, the transistor 32 is turned on with the consequence that, as the voltage potential 420 is driven up, charge flows via the bit line 10 into the still open selection transistor with the storage capacitor of the memory cell 4. This is then charged up to 1.8 V. This process corresponds to the actual refresh in binary logic.

The right-hand side of FIG. 2a is illustrated in simplified fashion, since it is possible for the voltage potential 100, when the transistor 32 opens, firstly to experience a drop in potential before it is driven up by the voltage source 42.

The particular advantages of the present invention reside in the provision of a method enabling three voltage levels to be stored in a DRAM memory cell temporarily or permanently. It has been found, in particular, that the lengthening of the read-out times which is brought about by the operation of the transistors in the sub-threshold range at increased threshold voltages does not affect the test sequence in the case where the arrangement is used in the defect testing range of memory cells.

What is claimed is:

1. A circuit for reading out, evaluating and rewriting a charge state to a memory cell, the circuit comprising:
   a bit line;
   a memory cell coupled to the bit line;
   a reference bit line;
   a reference memory cell for providing a comparison potential, the reference memory cell being coupled to the reference bit line;
   a first n-channel field-effect transistor that includes a gate terminal coupled to the bit line and a drain terminal coupled to the reference bit line;
   a second n-channel field-effect transistor that includes a gate terminal coupled to the reference bit line and a drain terminal coupled to the bit line;
   a first p-channel field-effect transistor that includes a gate coupled to the bit line and a drain terminal coupled to the reference bit line;
   a second p-channel field-effect transistor that includes a gate terminal coupled to the reference bit line and a drain terminal coupled to the bit line;
   a first voltage source coupled to a source terminal of the first n-channel field effect transistor and to a source terminal of the second n-channel field-effect transistor, the first voltage source for driving a voltage potential from an upper through to a lower limit; and
   a second voltage source coupled to a source terminal of the first p-channel field effect transistor and to a source terminal of the second p-channel field-effect transistor, the second voltage source for driving a voltage potential from the lower through to the upper limit;
   wherein the first and second n-channel field-effect transistors have a first threshold voltage and the first and second p-channel field-effect transistors have a second threshold voltage and wherein the magnitudes of the threshold voltages of the first and second n-channel and the first and second p-channel field-effect transistors are in each case greater than half the potential difference between the upper and lower limits of the voltage potential.

2. The circuit as claimed in claim 1, wherein the values of the first and of the second threshold voltage have a substantially identical magnitude.

3. The circuit as claimed in claim 1, wherein:
   at least one of the field-effect transistors has a bulk terminal;
   the bulk terminal is coupled to a voltage source for generating a substrate bias voltage potential; and
   the voltage source for generating a substrate bias voltage potential is adjustable between at least two different values for the substrate bias voltage potential.

4. The circuit as claimed in claim 1, wherein the value of the first and second threshold voltages is about four thirds of the difference between the upper and lower limits of the voltage potential.

5. The circuit as claimed in claim 1, wherein the memory cell comprises a dynamic random access memory cell.

6. A sense amplifier comprising:
   a first voltage source at an upper voltage level;
   a second voltage source at a lower voltage level;
   a first n-channel transistor that includes a gate, a source and a drain, the first n-channel transistor having a first threshold voltage that is greater than half of the difference between the upper voltage level and the lower voltage level;
   a second n-channel transistor that includes a gate, a source and a drain, the source being coupled to the source of the first n-channel transistor, the second n-channel transistor having the second threshold voltage;
   a first p-channel transistor that includes a gate, a source and a drain, the drain being coupled to the drain of the first n-channel transistor and the gate being coupled to the gate of the first n-channel transistor, the first p-channel transistor having a second threshold voltage that is greater than half of the difference between the upper voltage level and the lower voltage level; and
   a second p-channel transistor that includes a gate, a source and a drain, the drain being coupled to the drain of the second n-channel transistor, the gate being coupled to the gate of the second n-channel transistor, and the source being coupled to the source of the first p-channel transistor, the second p-channel transistor having the second threshold voltage.

7. The sense amplifier as claimed in claim 6, wherein the first threshold voltage and the second threshold voltage have a substantially identical magnitude.

8. The sense amplifier as claimed in claim 7, wherein the value of the first and second threshold voltages is about four thirds of the difference between the upper voltage level and the lower voltage level.

9. A method for operating a memory circuit, the method comprising:

reading out a charge from a memory cell to generate a voltage potential on a bit line;

reading out a charge from a reference memory cell to generate a voltage potential on a reference bit line;

driving a voltage potential at a first voltage source from a first value through to a second value;

driving a voltage potential at a second voltage source from the second value through to the first value; and reading-in again of a voltage potential on the bit line for the purpose of storing one of three possible stable charge states in the memory cell.

10. The method as claimed in claim 9, wherein the memory circuit is operated by a control unit with ternary logic.

11. The method as claimed in claim 9, wherein, depending on the charge state of the memory cell, an electrical connection from the memory cell to a control unit connected to the memory cell is interrupted by the blowing of a fuse circuit.

12. The method as claimed in claim 9, further comprising:
setting of a first value for at least one substrate bias voltage;
reading of a charge state into the memory cell;
setting of a second value for the at least one substrate bias voltage, the second value being different from the first value; and
reading out, evaluating and reading in again of the charge state into the memory cell.

13. The method as claimed in claim 9, further comprising: providing a sense amplifier, the sense amplifier comprising:
a first n-channel field-effect transistor that includes a gate terminal coupled to the bit line and a drain terminal coupled to the reference bit line;
a second n-channel field-effect transistor that includes a gate terminal coupled to the reference bit line and a drain terminal coupled to the bit line;
a first p-channel field-effect transistor that includes a gate coupled to the bit line and a drain terminal coupled to the reference bit line; and
a second p-channel field-effect transistor that includes a gate terminal coupled to the reference bit line and a drain terminal coupled to the bit line;
wherein the first voltage source is coupled to a source terminal of the first n-channel field effect transistor and to a source terminal of the second n-channel field-effect transistor; and
wherein the second voltage source is coupled to a source terminal of the first p-channel field effect transistor and to a source terminal of the second p-channel field-effect transistor; and
wherein the first and second n-channel field-effect transistors have a first threshold voltage and the first and second p-channel field-effect transistors have a second threshold voltage and wherein the magnitudes of the threshold voltages of the first and second n-channel and the first and second p-channel field-effect transistors are in each case greater than half the potential difference between the upper and lower limits of the voltage potential.

14. The method as claimed in claim 13, wherein the memory circuit is operated by a control unit with ternary logic.

15. The method as claimed in claim 13, wherein, depending on the charge state of the memory cell, an electrical connection from the memory cell to a control unit connected to the memory cell is interrupted by the blowing of a fuse circuit.

16. The method as claimed in claim 13, further comprising:
setting of a first value for at least one substrate bias voltage;
reading of a charge state into the memory cell;
setting of a second value for the at least one substrate bias voltage to change the threshold voltage of at least one of the n-channel field-effect transistors or p-channel field-effect transistors, the second value being different from the first value; and
reading out, evaluating and reading in again of the charge state into the memory cell.

17. The method as claimed in claim 13, wherein the first threshold voltage and the second threshold voltage have a substantially identical magnitude.

18. The method as claimed in claim 17, wherein the value of the first and second threshold voltages is about four thirds of the difference between the upper voltage level and the lower voltage level.

* * * * *